(12) United States Patent
Leobandung

(10) Patent No.: US 9,627,478 B1
(45) Date of Patent: Apr. 18, 2017

(54) INTEGRATED VERTICAL NANOWIRE MEMORY

(71) Applicant: International Business Machines Corporation, Armonk, NY (US)

(72) Inventor: Effendi Leobandung, Stormville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/965,285

(22) Filed: Dec. 10, 2015

(51) Int. Cl.
| | | |
|---|---|---|
| *H01L 29/06* | (2006.01) | |
| *H01L 29/423* | (2006.01) | |
| *H01L 29/78* | (2006.01) | |
| *H01L 29/66* | (2006.01) | |
| *H01L 21/02* | (2006.01) | |
| *H01L 21/283* | (2006.01) | |

(52) U.S. Cl.
CPC ...... *H01L 29/0676* (2013.01); *H01L 21/0262* (2013.01); *H01L 21/02603* (2013.01); *H01L 21/283* (2013.01); *H01L 29/42392* (2013.01); *H01L 29/66795* (2013.01); *H01L 29/785* (2013.01); *H01L 2029/7858* (2013.01)

(58) Field of Classification Search
CPC ............ H01L 27/2454; H01L 27/2463; H01L 29/0665; H01L 29/0676; H01L 29/068; H01L 29/775; H01L 45/06; H01L 45/1233; H01L 45/1286; H01L 45/144; H01L 45/148; H01L 45/1625; H01L 45/1666; H01L 29/42392; H01L 29/66795; H01L 29/785; H01L 21/02603; H01L 21/0262; H01L 2029/7858

USPC .............. 257/29, 20, 13, 192, 369, 14, 94; 438/301, 280; 365/163

See application file for complete search history.

(56) References Cited

U.S. PATENT DOCUMENTS

| | | |
|---|---|---|
| 6,246,083 B1 | 6/2001 | Noble |
| 6,707,095 B1 | 3/2004 | Chidambarrao et al. |
| 6,838,724 B2 | 1/2005 | Kowalski et al. |
| 7,005,346 B2 | 2/2006 | Manger |
| 7,087,472 B2 | 8/2006 | Hadizad |
| 8,643,087 B2 | 2/2014 | Sandhu et al. |
| 8,759,875 B1 | 6/2014 | Zheng et al. |
| 2006/0046391 A1 | 3/2006 | Tang et al. |
| 2006/0046407 A1 | 3/2006 | Juengling |
| 2011/0089400 A1* | 4/2011 | Ohlsson ................ B82Y 10/00 257/13 |

(Continued)

FOREIGN PATENT DOCUMENTS

| | | |
|---|---|---|
| CN | 103137563 | 6/2013 |
| JP | 3125469 | 5/1991 |
| JP | 3450242 | 7/2003 |

*Primary Examiner* — Mohammed Shamsuzzaman
(74) *Attorney, Agent, or Firm* — Scully, Scott, Murphy & Presser, P.C.; Louis J. Percello, Esq.

(57) ABSTRACT

A nanowire structure includes successive crystalline nanowire segments formed over a semiconductor substrate. A first crystalline segment formed directly on the semiconductor substrate provides electrical isolation between the substrate and the second crystalline segment. Second and fourth crystalline segments are each formed from a p-type or an n-type semiconductor material, while the third crystalline segment is formed from a semiconductor material that is oppositely doped with respect to the second and fourth crystalline segments.

15 Claims, 8 Drawing Sheets

(56) References Cited

U.S. PATENT DOCUMENTS

2011/0122682 A1* 5/2011 Elmegreen ............. B82Y 10/00
  365/163
2012/0280208 A1* 11/2012 Jain ....................... B82Y 10/00
  257/20

* cited by examiner

INTEGRATED VERTICAL NANOWIRE MEMORY

BACKGROUND

The present application relates generally to semiconductor devices, and more specifically to vertical nanowire devices and their methods of production.

Modern semiconductor devices such as Application Specific Integrated Circuits (ASIC) include sections of circuitry that perform digital logic, as well as analog and memory functions. As a dynamic random access memory (DRAM) cell is embedded into such devices, processes for manufacturing the device circuitry have become more complex.

It would be advantageous to provide an economical method for fabricating a semiconductor device such as ASIC that includes an embedded memory array.

SUMMARY

In accordance with embodiments of the present application, a vertically-oriented nanowire structure includes plural crystalline nanowire segments formed in succession over a semiconductor substrate. A first crystalline segment is formed directly on the semiconductor substrate and provides electrical isolation between the substrate and the second crystalline segment. Second and fourth crystalline segments, which define source and drain regions of an associated device, are each formed from a p-type or an n-type semiconductor material, while the third crystalline segment defines a channel region that oppositely doped with respect to the source and drain regions.

A method of forming a nanowire structure includes forming a first crystalline segment on a semiconductor substrate, forming a second crystalline segment directly on the first segment, forming a third crystalline segment directly on the second segment, and forming a fourth crystalline segment directly on the third segment. Each of the crystalline segments is formed using a vapor phase deposition method such as chemical vapor deposition. In embodiments, the gas phase chemistry used to form each of the second and fourth crystalline segments includes a p-type dopant or an n-type dopant, while the third crystalline segment is oppositely doped and is formed using an appropriate gas phase chemistry.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which.

DETAILED DESCRIPTION

Figure 1:
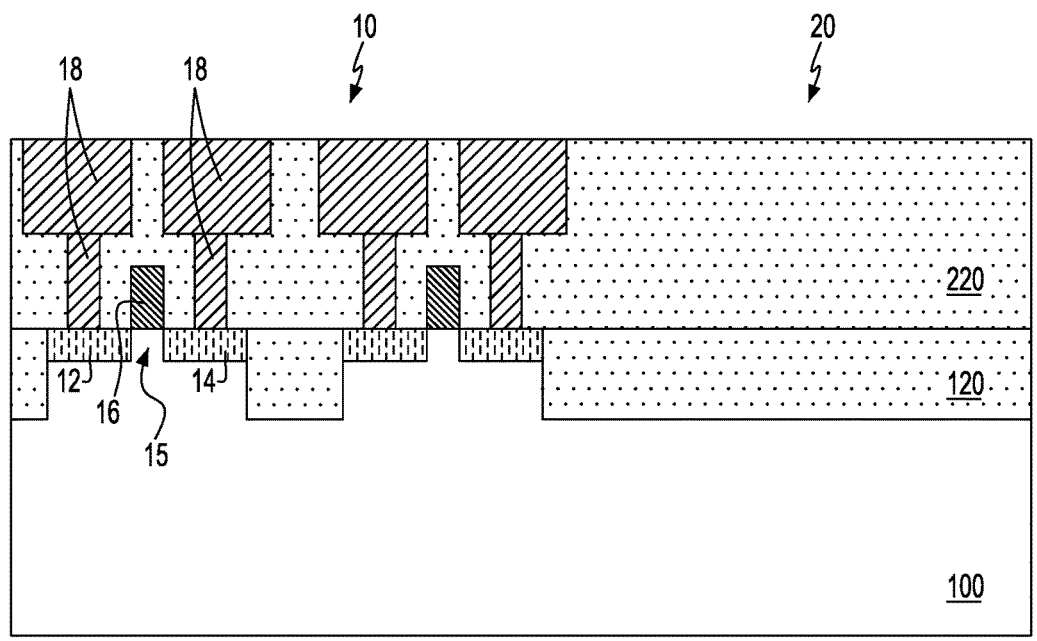
FIG. 1 is a schematic cross-sectional view of a semiconductor device having integrated logic and memory areas according to one embodiment.

Reference will now be made in greater detail to various embodiments of the subject matter of the present application, some embodiments of which are illustrated in the accompanying drawings. The same reference numerals will be used throughout the drawings to refer to the same or similar parts.

A schematic illustration of a semiconductor device comprising a logic area 10 and a memory area 20 is shown in FIG. 1. Logic area 10 may include one or more of a bipolar transistor, complimentary metal oxide semiconductor (CMOS) transistor, emitter coupled logic (ECL), as well as p-channel and n-channel metal oxide semiconductors (PMOS and NMOS). Compared to standalone memory used as external memory, significant performance advantages can be realized by integrating memory and processor functionality onto the same die or module. In the embodiment shown in FIG. 1, logic and memory structures are formed on a semiconductor substrate 100.

Substrate 100 may be a semiconductor material such as silicon or a silicon-containing material, including a bulk substrate. Silicon-containing materials include, but are not limited to, single crystal Si, polycrystalline Si, single crystal silicon germanium (SiGe), polycrystalline silicon germanium, silicon doped with carbon (Si:C), amorphous Si, as well as combinations and multi-layers thereof. As used herein, the term "single crystal" denotes a crystalline solid in which the crystal lattice of the entire sample is substantially continuous and substantially unbroken to the edges of the sample with substantially no grain boundaries.

In embodiments, substrate 100 may be a semiconductor-on-insulator (SOI) substrate. Further, substrate 100 is not limited to silicon-containing materials, as the substrate 100 may comprise other semiconductor materials, including Ge and compound semiconductors such as GaAs, InAs, and other like semiconductors.

In the illustrated embodiment, logic area 10 includes a conventional planar metal-oxide-semiconductor field effect transistor (MOSFET) known to those skilled in the art, including source region 12, drain region 14, channel region 15, gate stack 16, and contact metallization 18, though other transistor architectures may be used, including 3-dimensional (3D) architectures such as nanowire transistors or FinFETs.

Disclosed herein is an integrated semiconductor device architecture comprising a vertical nanowire-based DRAM. Although the architecture of the nanowire-based memory is described with reference to an embedded dynamic random-access memory (eDRAM), it will be appreciated that the disclosed nanowire-based memory may be utilized as a stand alone memory. The manufacture and resulting structure of the vertical nanowire-based, embedded dynamic random-access memory (eDRAM) is described herein with reference to FIGS. 2-12.

Figure 2:
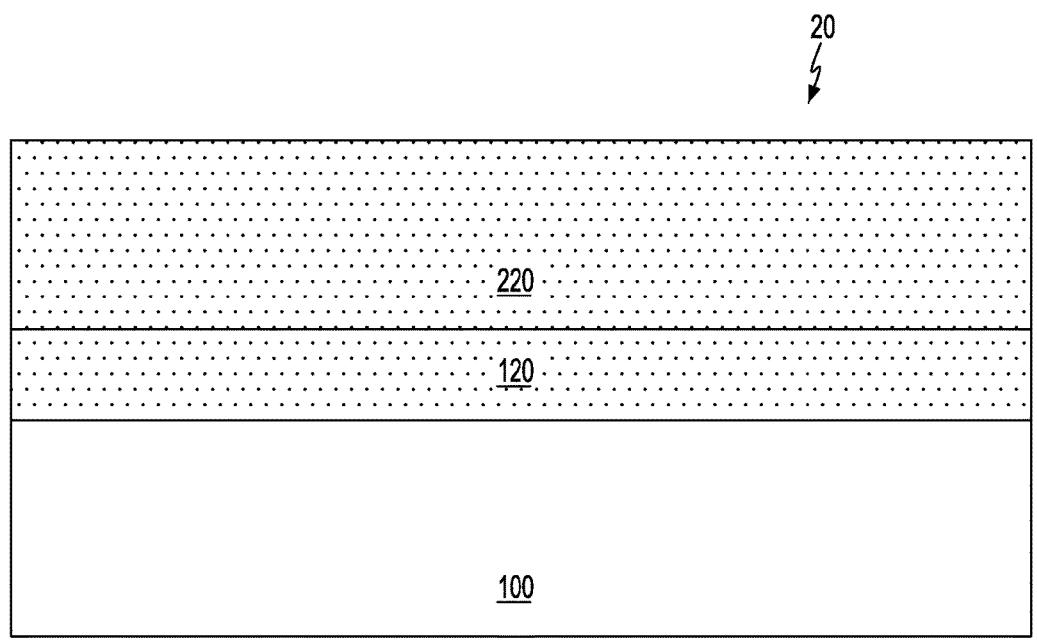
FIG. 2 is a cross-sectional view of a substrate architecture for forming an embedded dynamic random access memory (eDRAM) cell within the memory area of an integrated device.

With reference to FIG. 2, a shallow trench isolation layer 120 is formed within substrate 100 and a contact isolation layer 220 is formed over the substrate 100. Shallow trench isolation layer 120 and contact isolation layer 220 may each comprise any dielectric material including, for example, an oxide, nitride or oxynitride. In one embodiment, the shallow trench isolation layer 120 and contact isolation layer 220 each include silicon dioxide ($SiO_2$).

The dielectric material that provides shallow trench isolation layer 120 and contact isolation layer 220 may be formed, for example, by chemical vapor deposition (CVD), atomic layer deposition (ALD) or spin-coating. In embodiments, the dielectric material that provides the shallow trench isolation layer 120 and contact isolation layer 220 may be self-planarizing, or the top surface of the dielectric layer(s) can be planarized by chemical mechanical polishing (CMP). The shallow trench isolation layer 100 is formed by first providing a trench within the substrate 100 and then filling the trench with one of the above mentioned dielectric materials. The thickness of the shallow trench isolation layer 120 and contact isolation layer 220 may independently range from 0.1 to 1 microns.

Figure 3:
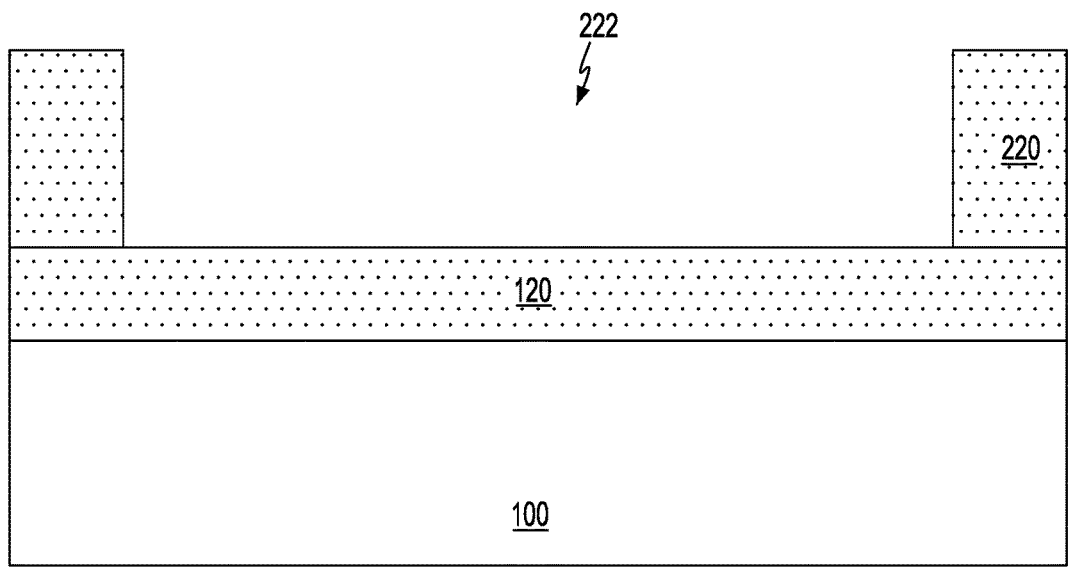
FIG. 3 shows the formation of a recess within a contact isolation layer of the substrate architecture.

As shown in FIG. 3, a recess 222 is formed in contact isolation layer 220 and within the memory area 20 exposing shallow trench isolation layer 120 using conventional photolithography and etching methods. Photolithography includes forming a layer of photoresist material (not shown) atop a material or material stack to be patterned. The photoresist material may include a positive-tone photoresist composition, a negative-tone photoresist composition, or a hybrid-tone photoresist composition. A layer of photoresist material may be formed by a deposition process such as, for example, spin-on coating.

The deposited photoresist is then subjected to a pattern of irradiation, and the exposed photoresist material is developed utilizing a conventional resist developer. In the instant embodiment, this provides a patterned layer of photoresist atop a portion of the contact isolation layer 220. The pattern provided by the patterned photoresist material is thereafter transferred into the underlying material layer or material layers utilizing at least one pattern transfer etching process.

The pattern transfer etching process may be an isotropic etch or an anisotropic etch. In embodiments, a dry etching process such as, for example, reactive ion etching can be used. In other embodiments, a wet chemical etchant can be used. In still further embodiments, a combination of dry etching and wet etching can be used. The pattern transfer etching may stop on the shallow trench isolation layer 120, or a portion of the shallow trench isolation layer 120 may be removed during the formation of recess 222.

Figure 4:
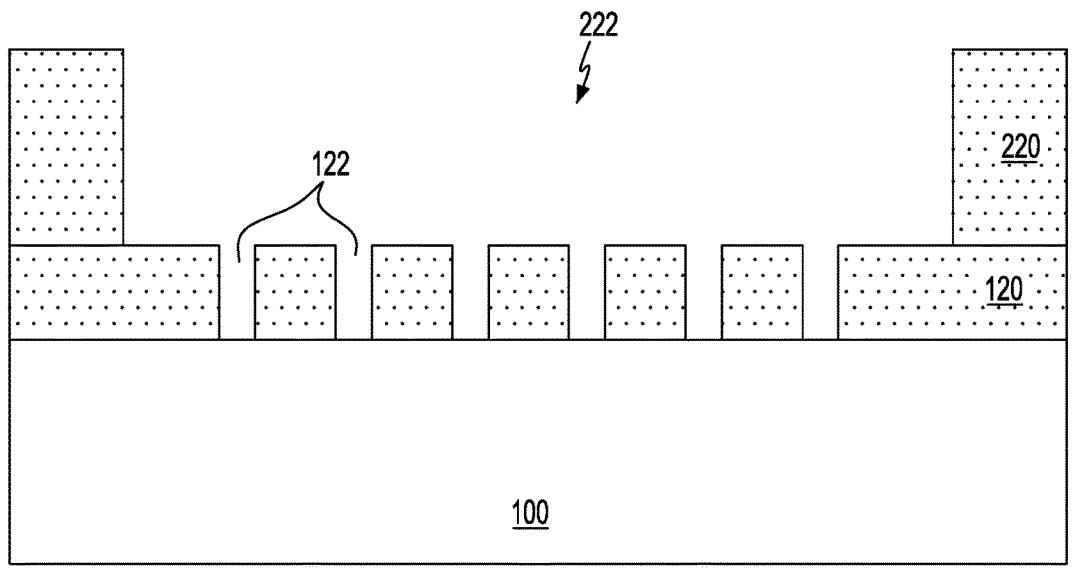
FIG. 4 shows the etching of vias into a shallow trench isolation layer within the recess of the contact isolation layer.

With reference to FIG. 4, a further photolithography and etching method is used to form a plurality of vias 122 in shallow trench isolation layer 120 within the memory area 20. As illustrated, a top surface of substrate 100 is exposed as the bottom of each via 122. The diameter of the vias 122 may range from 10 to 100 nm, e.g., 10, 20, 50 or 100 nm, including ranges between any the foregoing values, and the spacing between vias may range from 50 to 200 nm, e.g., 100 nm. According to various embodiments, vias 122 are formed in a silicon nitride or silicon oxide shallow trench isolation layer 120 over a silicon substrate 100, such that the vias extend through the shallow trench isolation layer 120 to the substrate 100.

Figure 5:
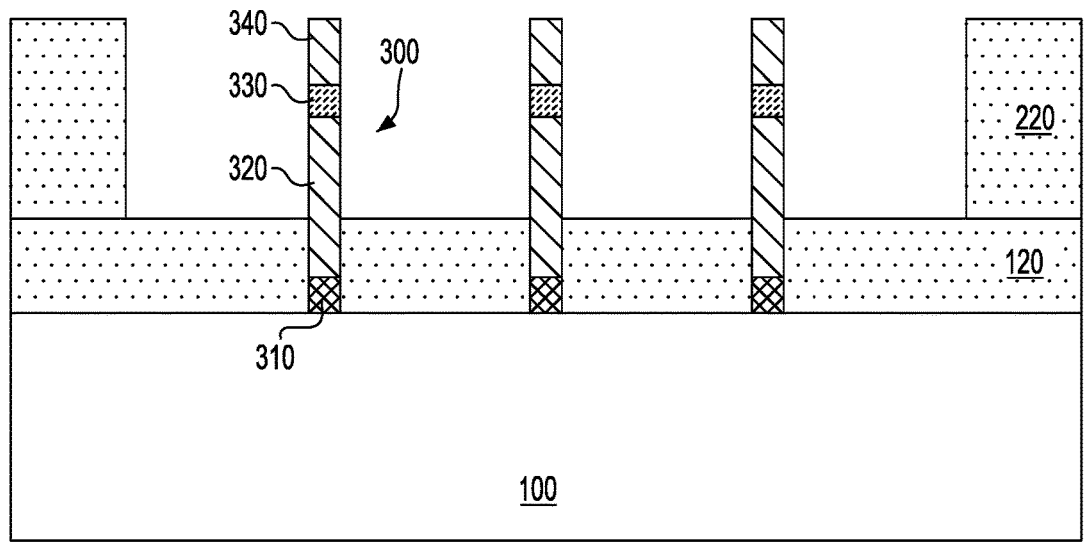
FIG. 5 illustrates the formation of vertical, selectively-doped nanowires within and above the vias that extend into the recess.

Turning to FIG. 5, a selective epitaxial process is used to form composite nanowires 300 within vias 122 that extend away from the substrate 100 and in the memory area 20. In embodiments, the direction of nanowire growth is substantially orthogonal to a major surface of the substrate 100. Nanowire growth is initiated at the bottom of vias 122 on the surface of substrate 100. By way of example, a low pressure metal organic vapor phase epitaxy (LP-MOVPE) process may be used to grow successive segments of a composite nanowire 300. However, other suitable techniques include, but are not limited to, molecular beam epitaxy (MBE) and chemical beam epitaxy (CBE).

The terms "epitaxy," "epitaxial" and/or "epitaxial growth and/or deposition" refer to the growth of a semiconductor material layer on a deposition surface of a semiconductor material, where the semiconductor material layer being grown assumes the same crystalline habit as the semiconductor material of the deposition surface. For example, in an epitaxial deposition process, chemical reactants provided by source gases are controlled and the system parameters are set so that depositing atoms alight on the deposition surface and remain sufficiently mobile via surface diffusion to orient themselves according to the crystalline orientation of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation.

Nanowire segments may each independently comprise a semiconductor material such as silicon (Si), germanium (Ge), silicon germanium (SiGe), III-V compound semiconductors such as GaAs, GaN, GaP, InAs, InSb, ZnSe, and ZnS, and II-VI compound semiconductors such as CdSe, CdS, CdTe, ZnSe, ZnS and ZnTe. Segments of the nanowire may be doped, e.g., p-type or n-type.

As used herein, "p-type" refers to the addition of impurities that creates a deficiency of valence electrons. For a silicon-containing material, example p-type dopants, i.e., impurities, include but are not limited to boron, aluminum, gallium, and indium. As used herein, "n-type" refers to the addition of impurities that contribute free electrons to an intrinsic semiconductor. In a silicon-containing material, example n-type dopants, i.e., impurities, include but are not limited to, antimony, arsenic, and phosphorus.

As shown in FIG. 5, composite nanowire 300 comprises plural discrete longitudinal segments 310, 320, 330 and 340. In embodiments, nanowire 300 comprises, from bottom to top, an oxidizable region 310, a source region 320, a channel region 330, and a drain region 340. The oxidizable region 310, which is formed directly on substrate 100, comprises an oxidizable material such as aluminum arsenide (AlAs). Oxidizable region 310 is oxidized in a subsequent step to form an insulating (isolation) layer between source region 320 and the substrate 100. In embodiments, the height of the oxidizable region 310 may range from 50 to 100 nm.

Deposited over oxidizable layer 310 are, in succession, source region 320, channel region 330 and drain region 340. In embodiments, each successive region of the nanowire is formed directly on an exposed surface of the previously-formed region, e.g., via a gas phase deposition method such as chemical vapor deposition, i.e., chemical vapor epitaxy. In embodiments, direct deposition of each successive region of the nanowire is performed without use of a catalyst layer. In embodiments, the nanowire has a substantially circular cross section with a diameter of 10 to 100 nm, e.g., 10, 20, 50 or 100 nm, including ranges between any the foregoing values.

In embodiments, source region 320 and drain region 340 may be doped, while channel region 330 may comprise an undoped (i.e., intrinsic) semiconductor material. In alternate embodiments, each of source region 320, channel region 330, and drain region 340 may be doped. For example, source region 320 and drain region 340 may be doped n-type and channel region 330 doped p-type to form a nanowire having a n-p-n structure, or source region 320 and drain region 340 may be doped p-type and channel region 330 doped n-type to form a nanowire having a p-n-p structure. The dopant concentration (p-type or n-type) within the source region 320 and drain region 340 may independently range from $1\times10^{19}$ atoms/cm$^3$ to $5\times10^{21}$ atoms/cm$^3$, e.g., $5\times10^{19}$ atoms/cm$^3$ to $1\times10^{21}$ atoms/cm$^3$. The dopant concentration (p-type or n-type) within the channel region 330 may range from $1\times10^{16}$ atoms/cm$^3$ to $1\times10^{18}$ atoms/cm$^3$, e.g., $5\times10^{16}$ atoms/cm$^3$ to $5\times10^{17}$ atoms/cm$^3$. Doping of the nanowire segments may be performed in situ, i.e., during formation of the nanowire by incorporating one or more dopant into the gas phase chemistry used to form the nanowires.

The height of the channel region 330 may range from 20 to 50 nm. The total nanowire height may range from 0.1 to 1 microns and, in embodiments, may extend above the shallow trench isolation layer 120. In alternate embodiments, nanowire 300 is formed entirely within vias 122. In such a case, shallow trench isolation layer 120 provides a radial boundary that limits the lateral dimension of the nanowire to the diameter of the via. Thus, the deposition process used to form vertical nanowire 300 yields a structure that is initially disposed at least partially within, and radially encased by shallow trench isolation layer 120.

After forming vertical nanowires 300, shallow trench isolation layer 120 is removed to expose the substrate 100 within recess 222. Removal of the shallow trench isolation layer 120 from within recess 222 leaves a free-standing vertical nanowire 300. In embodiments, a dry etching process such as, for example, reactive ion etching can be used to etch the shallow trench isolation layer. In other embodiments, a wet chemical etchant can be used. In still further embodiments, a combination of dry etching and wet etching can be used.

Figure 6:
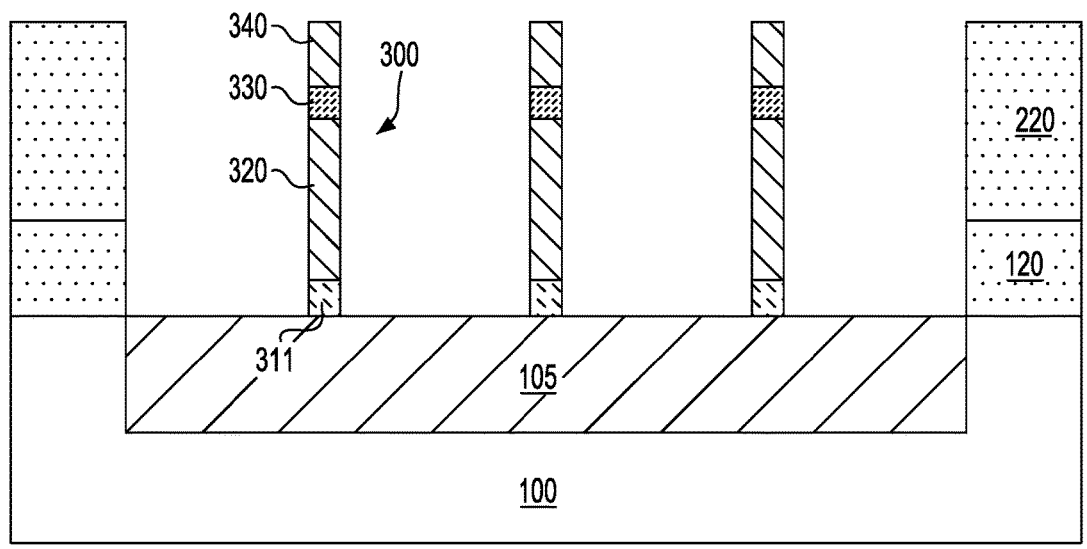
FIG. 6 depicts etching of the shallow trench isolation layer within the recess and the subsequent formation of a doped well within the substrate.

As seen with reference to FIG. 6, a doped well 105 is formed in the near-surface region of the substrate proximate to vertical nanowires 300. Well 105 may be formed by ion implantation. By way of example, an n-type well 105 may be formed in a silicon substrate by implantation with arsenic or phosphorus. In another example, a p-type well 105 may be formed in a silicon substrate by implantation with boron or $BF_2$. The dopant concentration (p-type or n-type) within the well 105 may range from $1\times10^{18}$ atoms/cm$^3$ to $5\times10^{21}$ atoms/cm$^3$, e.g., $5\times10^{19}$ atoms/cm$^3$ to $1\times10^{21}$ atoms/cm$^3$.

The oxidizable layer 310 is oxidized, for example, by exposure to an oxygen-containing plasma to form oxidized layer 311. Oxidized layer 311 is electrically insulating and provides electrical isolation between the well 105 and the source region 320 of the vertical nanowire.

Well 105 may be doped before or after the oxidizable layer is oxidized. In embodiments, following etching of the shallow trench isolation layer 120, ion implantation and the attendant formation of well 105 may precede oxidation of oxidizable layer 310. In such a case, the thermal budget associated with oxidation may drive diffusion of implanted dopants within well 105. In alternate embodiments, oxidation of the oxidizable layer 310 to form oxidized layer 311 may precede ion implantation to form well 105.

Figure 7:
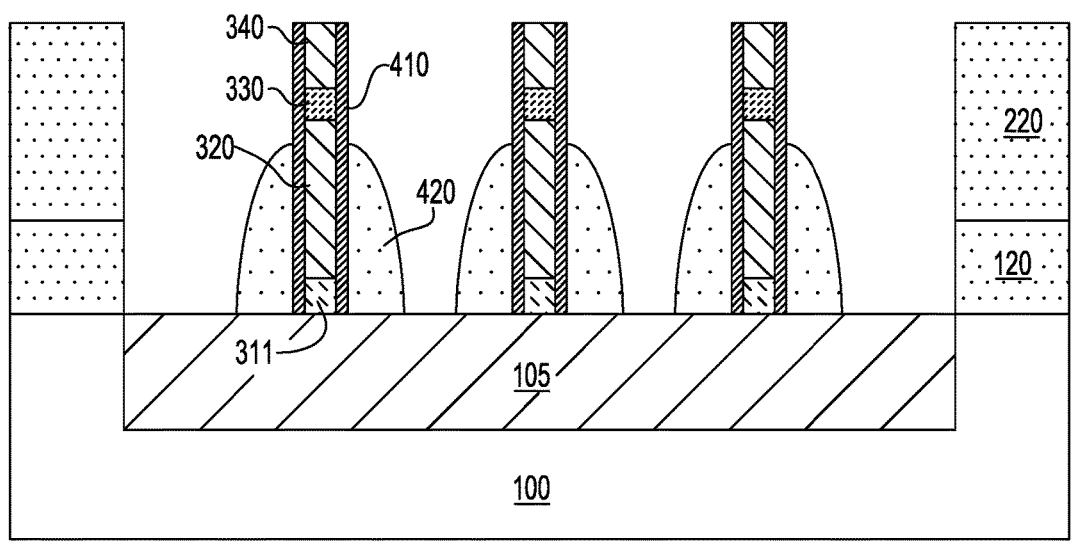
FIG. 7 shows formation of a dielectric layer over sidewalls of the nanowires and the deposition of a conductive layer over the dielectric layer.

As seen with reference to FIG. 7, a gate dielectric 410 is deposited over sidewalls of nanowire 300, and a metal strap 420 is formed over a lower portion of the gate dielectric 410. In embodiments, a wrap-around gate dielectric 410 is formed directly over the entire sidewall of vertical nanowire 300, while wrap-around metal strap 420 is formed adjacent only to source region 320.

In an example method, the gate dielectric 410 comprises a high-k dielectric material that is deposited on exposed surfaces of the structure shown in FIG. 6. A directional etch is then used to remove the high-k material from horizontal surfaces leaving the dielectric material only on the sidewalls of the nanowires 300.

In a similar vein, after deposition of the gate dielectric 410, metal strap 420 may be formed by blanket deposition of a conductive material followed by a directional etch and recess etch to expose the gate dielectric 410 adjacent to the drain region 340 and the channel region 330. For instance, metal strap 420 may be etched to recess its top surface below the bottom surface of channel region 330.

The gate dielectric 410 may include silicon oxide, silicon nitride, silicon oxynitride, a high-k dielectric, or other suitable material. As used herein, a high-k material has a dielectric constant greater than that of silicon oxide. A high-k dielectric may include a binary or ternary compound such as hafnium oxide ($HfO_2$). Further exemplary high-k dielectrics include, but are not limited to, $ZrO_2$, $La_2O_3$, $Al_2O_3$, $TiO_2$, $SrTiO_3$, $BaTiO_3$, $LaAlO_3$, $Y_2O_3$, $HfO_xN_y$, $HfSiO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiO_xN_y$, $SiN_x$, as well as silicates and alloys thereof. Each value of x may independently vary from 0.5 to 3, and each value of y may independently vary from 0 to 2.

The gate dielectric 410 may be deposited by a suitable process such as atomic layer deposition (ALD), chemical vapor deposition (CVD), physical vapor deposition (PVD), thermal oxidation, UV-ozone oxidation, or combinations thereof. The gate dielectric thickness may range from 1 nm to 10 nm, e.g., 1, 2, 4, 6, 8 or 10 nm, including ranges between any of the foregoing values.

Metal strap 420 may include a conductive material such as polysilicon, silicon-germanium, a conductive metal such as Al, W, Cu, Ti, Ta, W, Pt, Ag, Au, Ru, Ir, Rh and Re, alloys of conductive metals, e.g., Al—Cu, silicides of a conductive metal, e.g., W silicide, and Pt silicide, or other conductive metal compounds such as TiN, TiC, TiSiN, TiTaN, TaN, TaAlN, TaSiN, TaRuN, WSiN, NiSi, CoSi, as well as combinations thereof.

The metal strap 420 can be formed utilizing a conventional deposition process such as, for example, atomic layer deposition (ALD), chemical vapor deposition (CVD), metalorganic chemical vapor deposition (MOCVD), molecular beam epitaxy (MBE), and sputtering.

Figure 8:
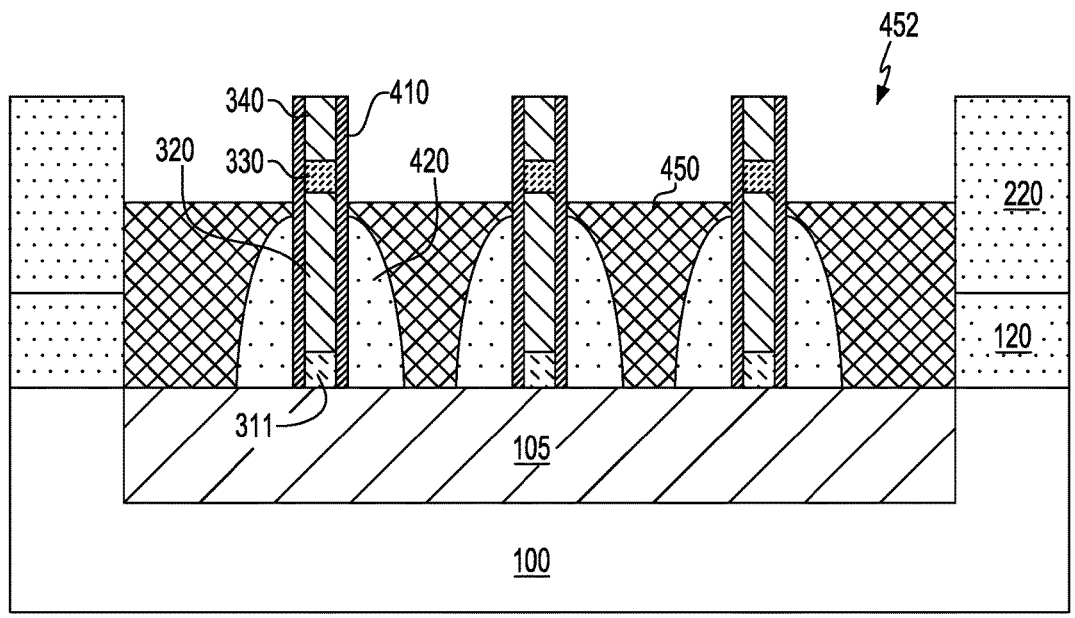
FIG. 8 shows the structure of FIG. 7 after the deposition of a dielectric spacer.

FIG. 8 shows an intermediate device architecture after deposition, planarization and recessing of a dielectric spacer 450. "Planarization" is a material removal process that employs at least mechanical forces, such as frictional media, to produce a substantially two-dimensional surface. A planarization process may include chemical mechanical polishing (CMP) or grinding. Chemical mechanical polishing (CMP) is a material removal process that uses both chemical reactions and mechanical forces to remove material and planarize a surface. In embodiments, nanowires 300 may serve as an etch stop for a planarization process that removes excess material from dielectric spacer 450 (i.e., overburden).

Dielectric spacer 450 may comprise a low-k dielectric material. Exemplary low-k dielectric materials include, but are not limited to, amorphous carbon, fluorine-doped oxides, carbon-doped oxides, SiCOH or SiBCN. Commercially-available low-k dielectric products and materials include Dow Corning's SiLK™ and porous SiLK™, Applied Materials' Black Diamond™, Texas Instrument's Coral™ and TSMC's Black Diamond™ and Coral™. The dielectric spacer 450 may be deposited by plasma enhanced chemical vapor deposition (PECVD). As used herein, a low-k material has a dielectric constant less than that of silicon oxide.

Figure 9A:
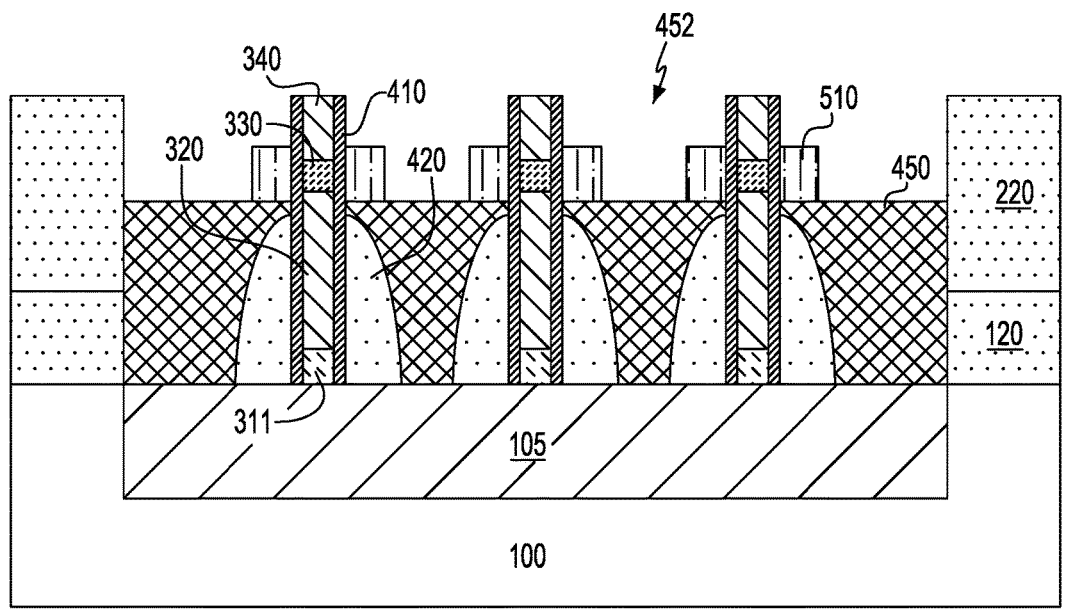
FIG. 9A shows the formation of a metal gate peripheral to each nanowire and aligned with a channel region thereof.
Figure 9B:
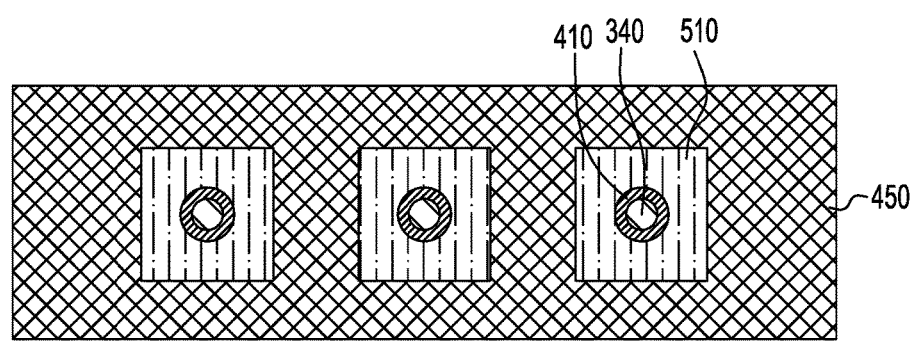
FIG. 9B is a top down plan view showing the alignment of the metal gates with the nanowires.

Next, using a dry and/or wet etch, dielectric spacer 450 is recessed to a height below the bottom of channel regions 330 and above the metal straps 420 to create openings 452 into which, as shown in FIG. 9A, a conductive material is deposited, planarized, recessed and patterned to form gate electrodes 510 that wrap-around the channel region 330 of nanowires 300. The height of the gate electrode 510 may range from substantially equal to the height of the channel region 330 to twice the height of the channel region 330. A plan view of the architecture of FIG. 9A is depicted in FIG. 9B, which shows exposed drain region 340 at the top of nanowire 300, gate oxide 410 and gate electrode 510 enveloping the periphery of the nanowire, i.e., adjacent to channel region 330, and dielectric spacer 450.

The gate electrodes 510 may include a conductive material such as polysilicon, silicon-germanium, a conductive metal such as Al, W, Cu, Ti, Ta, W, Pt, Ag, Au, Ru, Ir, Rh and Re, alloys of conductive metals, e.g., Al—Cu, silicides of a conductive metal, e.g., W silicide, and Pt silicide, or other conductive metal compounds such as TiN, TiC, TiSiN, TiTaN, TaN, TaAlN, TaSiN, TaRuN, WSiN, NiSi, CoSi, as well as combinations thereof. The gate electrode 510 may comprise one or more layers of such materials.

The gate electrode 510 can be formed utilizing a conventional deposition process such as, for example, ALD, CVD, metalorganic chemical vapor deposition (MOCVD), molecular beam epitaxy (MBE), physical vapor deposition, sputtering, evaporation, ion beam deposition, electron beam deposition, laser assisted deposition, or chemical solution deposition.

In an example method of forming gate electrodes 510, a blanket conductive layer is formed within openings 452, planarized to remove the overburden, and then selectively etched (i.e., patterned and recessed) to form discrete, wrap-around gate electrodes 510.

Figure 10A:
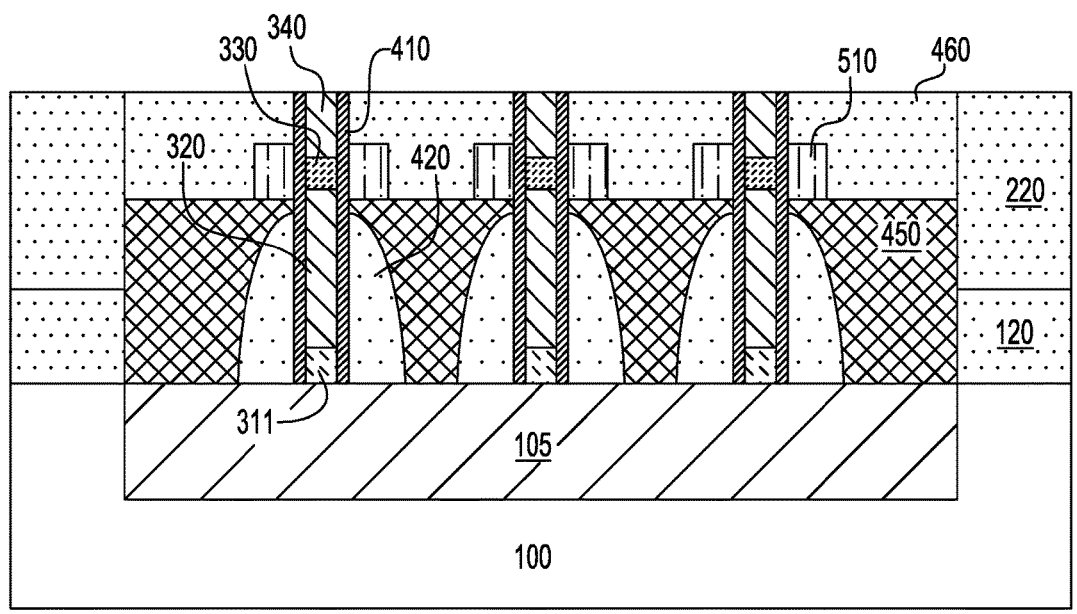
FIG. 10A shows formation of a capping dielectric layer.
Figure 10B:
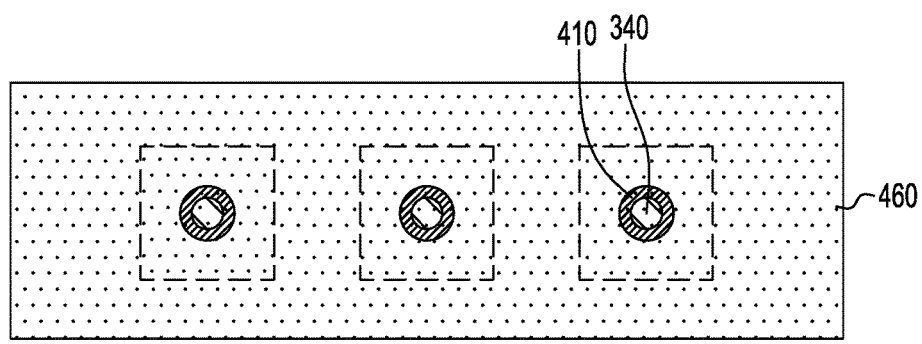
FIG. 10B is a top down plan view of the structure of FIG. 10A.

Referring to FIGS. 10A and 10B, a further dielectric layer 460 is used to backfill the remainder of opening 452 and cover the gate electrodes 510. Dielectric layer 460 is planarized, i.e., to a height of nanowires 300 using, for example, chemical mechanical polishing. The nanowires 300 may serve as an etch stop for a planarization process that removes excess dielectric material. Suitable compositions for dielectric layer 460 are disclosed above with respect to dielectric layer 450. Dielectric layers 450, 460 may have the same or different compositions.

A metallization architecture may then be formed over the planarized structure of FIG. 10 using conventional techniques. Metallization architecture includes contact structures such as bit lines 610 and word lines 620 that may be formed, for example, using a directional deposition method such as evaporation or collimated physical vapor deposition.

Bit lines 610 may be formed directly over exposed top surfaces of nanowires 300 to form electrical contacts with drain regions 340. Contacts vias 625 may be formed through a further dielectric layer 470 and dielectric layer 460, and word lines 620 may be formed in electrical contact with gate electrodes 510. Suitable compositions for dielectric layer 470 are disclosed above with respect to dielectric layer 450. Dielectric layers 450, 460 and 470 may have the same or different compositions.

In embodiments, bit line 610 and word line 620 comprise a conductive material that forms ohmic contacts with the drain regions 340 and the gate electrodes 510, respectively. Exemplary conductive materials for the bit line 610 and word line 620 include Al, Cu, Ti/Au, Pt/Ni, Au/Ge/Ni, for example.

Figure 11A:
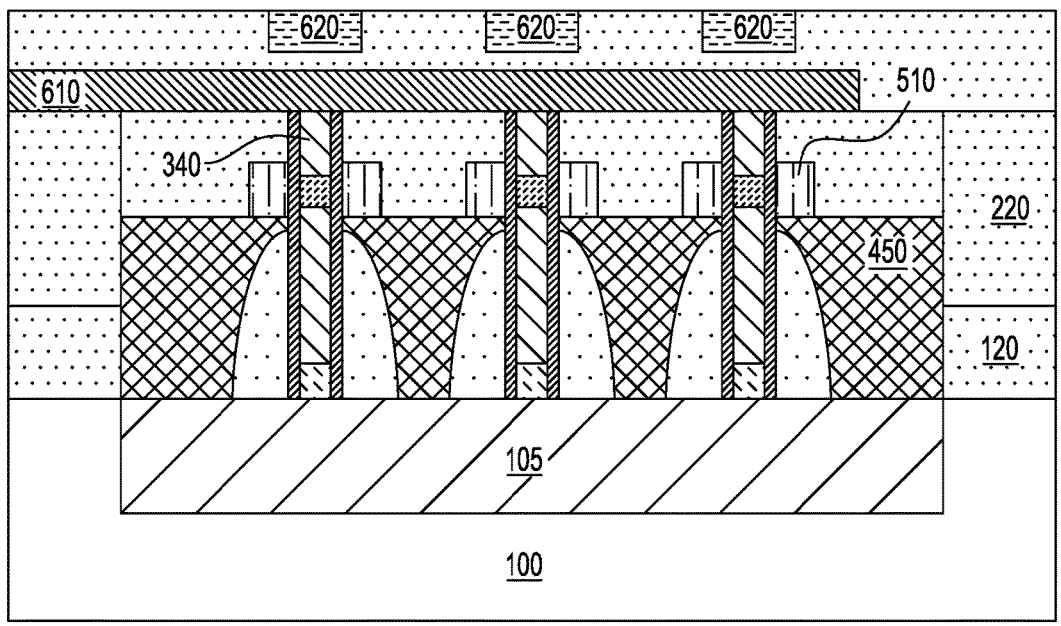
FIG. 11A shows an eDRAM cell after the formation of metallization structures including a word line in electrical contact with metal gate and a bit line in contact with the drain region of each nanowire.
Figure 11B:
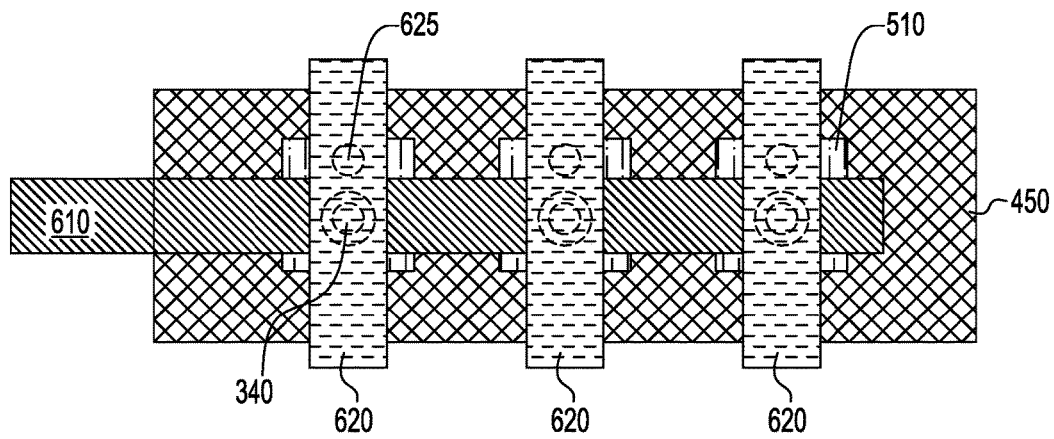
FIG. 11B is a top down plan view showing the alignment of the metallization structures.

FIG. 11A is a cross-sectional view showing the formation of bit line 610, word lines 620 and dielectric layer 470 after planarization of the structure. FIG. 11B illustrates a top view of adjacent memory cells within a row of an example memory array. According to the illustrated embodiment, bit line 610 is formed adjacent to one row of nanowires 300, such that the drain region 340 of each nanowire in the row is in contact with the bit line 610. Word lines 620 are formed orthogonal to each row of nanowires 300, such that the gate electrode 510 of each nanowire in the row is in contact with a respective word line 620.

According to embodiments, a nanowire device comprises a nanowire structure extending vertically from a major surface of substrate, a channel region disposed within the nanowire structure, the channel region having a height and a perimeter orthogonal to the height, a gate electrode extending around the perimeter of the channel region, respective source and drain regions disposed within the nanowire structure on either side of the channel region, a first contact line in electrical contact with the drain region, and a second contact line in electrical contact with the gate electrode.

Illustrated in FIGS. 2-11A and 11B are embodiments of a process to form an embedded DRAM architecture having source, drain and channel regions defined by contiguous segments of a vertical nanowire. The channel region 330 comprises a wrap-around gate 510 that is in electrical contact with a word line 620. The source region 340 of the nanowire is in contact with a bit line 610, and the drain region 320 of the nanowire is grounded via metal strap 420 to well 105 in substrate 100.

The disclosed structures may be arranged in a memory array having plural memory cells, where the cells in the array are arranged in rows and columns. In embodiments, word lines 620 connect the memory cells in the rows and bit lines connect the memory cells in the columns. Control circuitry (not shown) may be provided to select a desired row and a desired column, and read circuitry may be provided to detect a memory state for a selected memory cell in the memory array.

Figure 12:
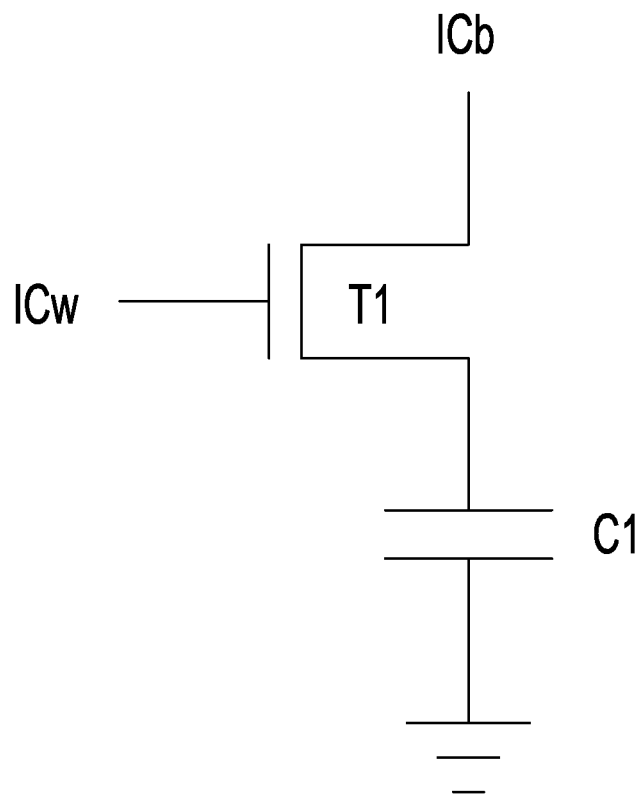
FIG. 12 is a simplified circuit diagram of the eDRAM of FIGS. 11A-11B.

A circuit diagram for the embedded DRAM cell is shown in FIG. 12. The eDRAM cell has a storage capacitor (C1) to retain digital data as electrical charge and a pass gate transistor (T1). A first plate of the cell capacitor is contiguous with the source region 320 of the pass gate transistor. A second plate of the cell capacitor is connected to the substrate 100 via metal strap 420.

The pass gate transistor has a source region 320 contiguous with the first plate of the cell capacitor, a drain region 340 connected to bit line (ICb) 610, a gate electrode 510 connected to a word line (ICw) 620, and a gate oxide 410. The gate oxide 410 separates the gate electrode 510 from a channel region 330 that, in turn, separates source region 320 from drain region 340.

As used herein, the singular forms "a," "an" and "the" include plural referents unless the context clearly dictates otherwise. Thus, for example, reference to a "vertical nanowire" includes examples having two or more such "nanowires" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be understood that when an element such as a layer, region or substrate is referred to as being formed on, deposited on, or disposed "on" or "over" another element, it can be directly on the other element or intervening elements may also be present. In contrast, when an element is referred to as being "directly on" or "directly over" another element, no intervening elements are present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a channel region of a nanowire that comprises an intrinsic semiconductor material include embodiments where the channel region consists essentially of an intrinsic semiconductor material and embodiments where the channel region consists of an intrinsic semiconductor material.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed as new is:

1. A nanowire structure, comprising:
   an oxidized segment comprising an oxide of a semiconductor material located on a semiconductor substrate;
   a first crystalline segment located directly on the oxidized segment;
   a second crystalline segment located directly on the first segment;
   a third crystalline segment located directly on the second segment, wherein the first and third crystalline segments each comprise a p-type or an n-type semiconductor material, and the second crystalline segment comprises an intrinsic semiconductor material or a semiconductor material that is oppositely doped with respect to the first and third crystalline segments;
   a metal strap located over a gate dielectric and wrapping around the oxidized segment and the first crystalline segment;
   a dielectric spacer laterally surrounding the metal strap; and
   a wraparound gate electrode layer located over the dielectric spacer and laterally surrounding a portion of the gate dielectric proximate to the second crystalline segment.

2. The nanowire structure of claim 1, wherein the nanowire structure extends vertically from a major surface of the semiconductor substrate and has a height of from 0.1 micron to 1 micron.

3. The nanowire structure of claim 1, wherein the nanowire structure has a diameter of from 10 nm to 100 nm.

4. The nanowire structure of claim 1, wherein the second crystalline segment has a height of from 20 to 50 nm.

5. The nanowire structure of claim 1, wherein the oxidized segment is located on a doped region of the semiconductor substrate.

6. The nanowire structure of claim 1, further comprising the gate dielectric located over sidewalls of the oxidized segment, the first crystalline segment, the second crystalline segment and the third crystalline segment of the nanowire structure.

7. The nanowire structure of claim 1, further comprising a first contact line in electrical contact with the fourth third crystalline segment and a second contact line in electrical contact with the gate electrode layer.

8. The nanowire structure of claim 1, wherein the metal strap has a top surface located below a bottom surface of the second crystalline segment.

9. The nanowire structure of claim 1, wherein the dielectric spacer has a top surface located between the top surface of the metal strap and the bottom surface of the second crystalline segment.

10. The nanowire structure of claim 1, wherein the dielectric spacer comprises a low-k dielectric material.

11. The nanowire structure of claim 1, wherein the oxidized segment comprises an oxide of AlAs.

12. The nanowire structure of claim 1, wherein each of the first crystalline segment, the second crystalline segment and the third crystalline segment comprises Si, Ge, SiGe, GaAs, GaN, GaP, InAs, InSb, ZnSe, ZnS, CdSe, CdS, CdTe, ZnSe, ZnS or ZnTe.

13. The nanowire structure of claim 1, wherein each of the first crystalline segment, the second crystalline segment and the third crystalline segment has a same crystalline characteristics as the semiconductor substrate.

14. The nanowire structure of claim 1, wherein sidewalls of the oxidized segment, the first crystalline segment, the second crystalline segment and the third crystalline segment are vertically coincident with one another.

15. The nanowire structure of claim 1, further comprising a dielectric layer located over the gate electrode and the dielectric spacer, wherein the dielectric layer has a top surface coplanar with a top surface of the third crystalline segment.

* * * * *